United States Patent [19]
Scepanovic et al.

[11] Patent Number: 5,930,500
[45] Date of Patent: Jul. 27, 1999

[54] PARALLEL PROCESSOR IMPLEMENTATION OF NET ROUTING

[75] Inventors: Ranko Scepanovic, San Jose; Edwin Jones, Los Altos Hills, both of Calif.; Alexander E. Andreev, Moskovskaga Oblast, Russian Federation

[73] Assignee: LSI Logic Corporation, Milpitas, Calif.

[21] Appl. No.: 08/798,880

[22] Filed: Feb. 11, 1997

[51] Int. Cl.⁶ .................................................. G06F 17/50
[52] U.S. Cl. ............................. 395/500.14; 395/500.08
[58] Field of Search .................................. 364/488, 489, 364/490, 491

[56] References Cited

U.S. PATENT DOCUMENTS

| | | | |
|---|---|---|---|
| 4,630,219 | 12/1986 | DiGiacomo et al. | 364/488 |
| 4,858,143 | 8/1989 | Fournier | 364/491 |
| 4,908,772 | 3/1990 | Chi | 364/491 |
| 5,202,840 | 4/1993 | Wong | 364/490 |
| 5,590,063 | 12/1996 | Golio et al. | 364/580 |
| 5,682,321 | 10/1997 | Ding et al. | 364/490 |
| 5,798,936 | 8/1998 | Cheng | 364/489 |

OTHER PUBLICATIONS

Mayrhofer et al., "Congestion–Driven Placement Using a New Multi–Partitioning Heuristic," 1990 IEEE, pp. 332–335, 1990.

Tragoudas, "Min–Cut Partitioning on Underlying Tree and Graph Structures," 1996 IEEE, pp. 470–474, 1996.

*Primary Examiner*—James P. Trammell
*Assistant Examiner*—Leigh Marie Garbowski
*Attorney, Agent, or Firm*—Mitchell, Silberberg & Knupp LLP

[57] ABSTRACT

A method for maximizing effectiveness of parallel processing, using multiple processors, to connect pins of a net of an integrated circuit is disclosed. The method requires the pins to be partitioned into sets of pins and the sets of pins to be further partitioned into meta-sets of the sets of pins. The sets and the meta-sets are connected using a minimal spanning tree algorithm, and the connected sets are made to share a pin, thereby ensuring that the whole net is interconnected without creating a loop in the routing. In addition, because the partitions and the sets of partitions average approximately the same number of pins, the work load can easily be balanced between the processors.

23 Claims, 3 Drawing Sheets

PARALLEL PROCESSOR IMPLEMENTATION OF NET ROUTING

BACKGROUND OF THE INVENTION

1. Field of the Invention

The present invention generally relates to the art of microelectronic integrated circuit layout, and more specifically to the art of routing nets on integrated circuit chips.

2. Description of Related Art

Microelectronic integrated circuits consist of a large number of electronic components which are fabricated by layering several different materials on a silicon base or wafer. The design of an integrated circuit transforms a circuit description into a geometric description which is known as a layout. A layout consists of a set of planar geometric shapes in the various layers of the silicon chip.

The process of converting the specifications of an electrical circuit into a layout is called physical design. Physical design requires arranging elements, wires, and predefined cells on a fixed area, and the process can be tedious, time consuming, and prone to many errors due to tight tolerance requirements and the minuteness of the individual components, or cells.

Currently, the minimum geometric feature size of a component is on the order of 0.5 microns. Feature size may be reduced to 0.1 micron within the next several years. The current small feature size allows fabrication of as many as 10 million transistors or approximately 1 million gates of logic on a 25 millimeter by 25 millimeter chip. This feature-size-decrease/transistor-increase trend is expected to continue, with even smaller feature geometries and more circuit elements on an integrated circuit. Larger chip sizes will allow far greater numbers of circuit elements.

Due to the large number of components and the exacting details required by the fabrication process, physical design is not practical without the aid of computers. As a result, most phases of physical design use extensively Computer Aided Design (CAD) tools. Automation of the physical design process has increased the level of integration, reduced turn around time and enhanced chip performance.

The object of physical chip design is to determine an optimal arrangement of devices in a plane and to find an efficient interconnection or routing scheme between the devices that results in the desired functionality. Since space on the chip surface is at a premium, algorithms must use the space very efficiently to lower costs and improve yield. The arrangement of individual cells in an integrated circuit chip is known as a cell placement. In the following description, each arrangement of cells will be referred to as a placement.

Each microelectronic circuit device or cell includes a plurality of pins or terminals, each of which is connected to pins of other cells by a respective electrical interconnection wire network, or net. A purpose of the optimization process used in the physical design stage is to determine a cell placement such that all of the required interconnections can be made, but total wirelength and interconnection congestion are minimized. The process of determining the interconnections of already placed cells of an integrated circuit is called routing.

Assuming that a number N of cells are to be optimally arranged and routed on an integrated circuit chip, the number of different ways that the cells can be arranged on the chip, or the number of permutations, is equal to N! (N factorial). In addition, each of the cells may require multiple connection points (or pins), each of which, in turn, may require connections to multiple pins of multiple cells. The possible routing permutations are even larger than the possible cell placements by many orders of magnitude.

Because of the large number of possible placements and routing permutations, even computerized implementation of the placement algorithms discussed above can take many days. In addition, the placement and routing algorithms may need to be repeated with different parameters or different initial arrangements to improve the results.

To reduce the time required to optimally route the nets, multiple processors have been used to speed up the process. In such implementations, multiple processors are assigned to different areas of the chip to simultaneously route the nets in its assigned areas. However, it has been difficult to evenly distribute the amount of routing required from each of the multiple processors. In fact, due to the nonlinear algorithm complexity, the obvious, always assumed parallelization which is to split the nets among the processors does not work because routing of one highest fanout net can take much longer than routing of all other nets of the integrated circuit. Such unbalanced parallelization of the routing function has been the norm in the art, leading to ineffective use of parallel processing power.

In summary, because of the ever-increasing number of cells on an integrated chips (currently at millions of cells on a chip), and the resulting increase in the number of possible routing of the cells and the nets on the chips, multiple processors are used to simultaneously route the nets of an integrated chip. However, even with the aid of computers, existing methods can take several days, and the addition of processors may not decrease the required time because of the difficulties of balancing the amount of work between the processors.

SUMMARY OF THE INVENTION

These problems are addressed by apparatus and methods according to the present invention.

According to the present invention, there is provided a method of grouping the pins of a cell placement layout of an integrated circuit to achieve a balanced performance for parallel processing of the cell routing. First, the pins of the net are partitioned into neighborhoods and the best partitions are selected. Then, the pins are reassigned into better partitions and a minimal spanning method is used to create a graph structure of the partitions of the pins to create a minimally partitioned nets. The minimal spanning tree (MST) of the pins, thus defining the nets, can be used to assign groups of the pins to the multiple CPU's. The multiple CPU's simultaneously, or in parallel, connect the pins, thus routing the net.

The method of the present invention can be applied to the entire set of pins of an integrated circuit, but is best applied to each of the nets of the integrated circuit.

An apparatus for connecting pins of a net comprises a plurality of processors and memory connected to the processors. The memory stores the instructions for the processors to partition the pins, construction minimal spanning tree, and assign the nodes of the tree (which are the pin partitions or sets of the pin partitions) to each of the processors.

The apparatus may include other components such as a monitor and a harddrive to store information regarding the location of the pins, net routing requirements, etc.

The present invention also includes a computer storage medium that stores a plurality of executable instructions for instructing a computer for organizing integrated circuit pins for routing purposes, including instructions to partition the pins into a plurality of sets; to construct a spanning tree having vertices and edges; and to assign the sets in accordance with said edges of said spanning tree.

These and other aspects, features, and advantages of the present invention will be apparent to those persons having ordinary skilled in the art to which the present invention relates from the foregoing description and the accompanying drawings.

DETAILED DESCRIPTION OF THE PREFERRED EMBODIMENT(S)

Overview

Figure 1:
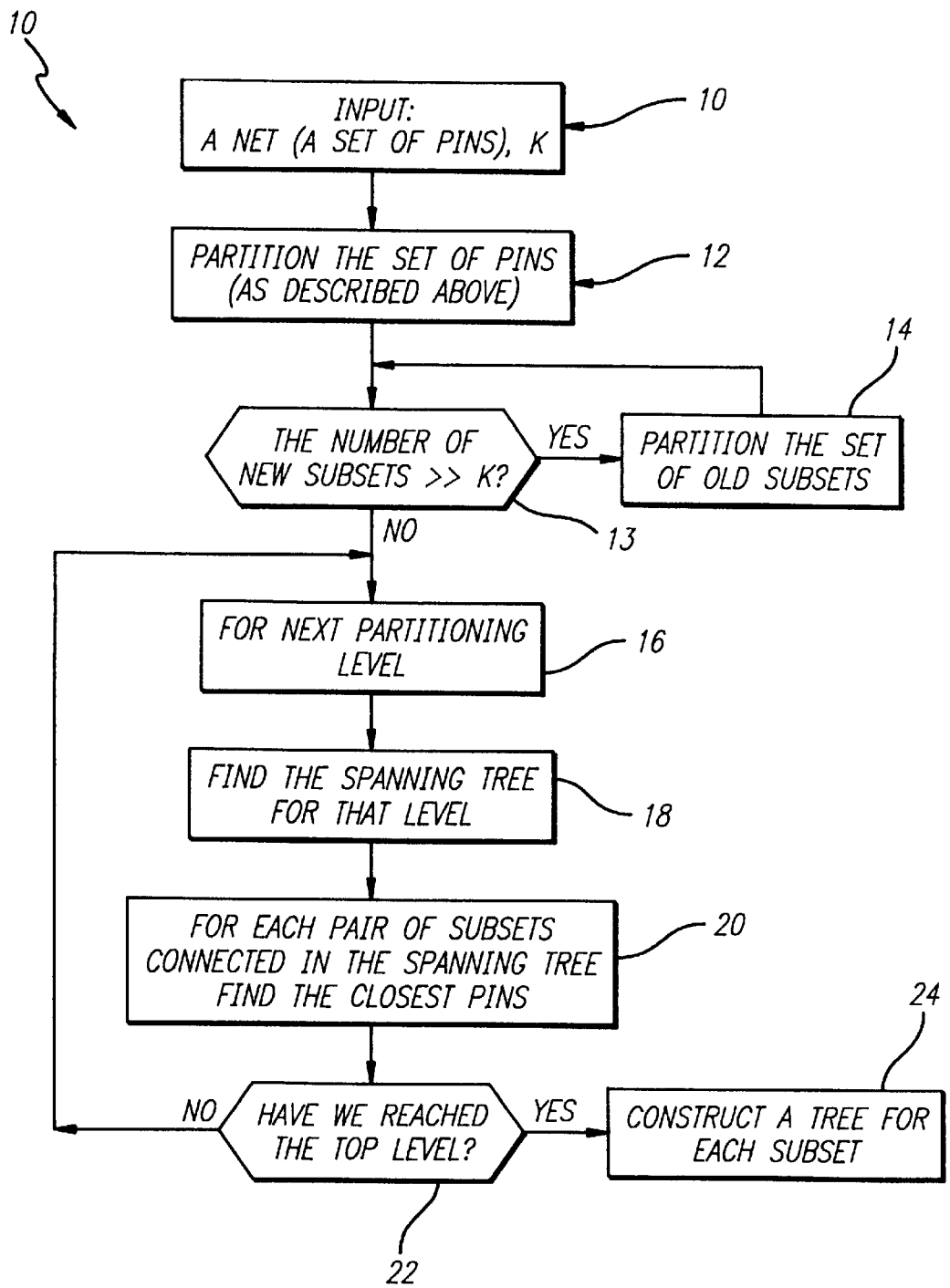
FIG. 1 is a flow-chart illustrating a method of organizing the pins of an integrated circuit in accordance with a preferred embodiment of the present invention.

Referring to FIG. 1, a flow chart 9 of the figure illustrates the method of organizing the pins of a net in accordance with the present invention. As indicated by the reference numeral 10, the net, or a set of pins, to route and the coordinates of each of the pins are provided into the system. Typically, the routing is performed after finalizing the placement of the cells on the integrated chip. Another given parameter is K which represents the size of the partitions into which the pins or subnets will be grouped for routing. K can be assigned any reasonable number which is less than the total number of pins of the net. In experiments, K of twenty (20) has shown to be preferable.

The step referenced by reference number 12 indicates that the pins are partitioned into sets of pins, each set containing, at minimum, the number of pins indicated by parameter K. The method of partitioning, or grouping, the pins into sets of pins will be discussed in detail in the Partitioning Method section below. Partitioning pins of a net into groups of K creates a number of pin-partitions (pp's). Because the pins of the net may number in the order of thousands or more, partitioning of the pins into groups of K (20 in this example) creates a large number of pp's. Specifically, in this instance, the number of pp's is only one order of magnitude smaller than the number of pins themselves.

Therefore, the partition method is iterated with pp's as the elements of the new partition. This operation is identified by boxes 13 and 14 of FIG. 1. As indicated by boxes 13 and 14, partitioning of the sets is iterated, using the sets of the previous iteration as the elements of the meta partition, until the number of the partitions is in the same order of magnitude as K. Because of the iterative application of the partitioning of the pins, the set, and the meta sets, the resultant partition hierarchy can be logically represented as a partition tree.

For example, if K is 20 and the integrated circuit contains 4,000 pins to be routed, the first partitioning of the pins into groups of about 20 pins each results in approximately 200 pin partitions (pp's). Because 200 is much larger than 20, the pp's are partitioned into sets of about 20 pp's each, resulting in approximately ten (10) sets of pp's. In this example, the number of sets of pp's, ten, is in the same order of magnitude as K, therefore, no further iteration of the partitioning step is necessary.

After the partitioning of the pins, as indicated by boxes 16 and 18, a Minimum Spanning Tree (MST) is created for each level of the partition tree, commencing at the lowest level of the tree. For each level of the sets and the sets of the sets of the pins, a MST is created with the pp's as the vertices.

After creating an MST for each set of the pp's, the partitions of each set pp's are redefined to "link" the partitions of the sets connected by the edge of the MST. This operation is indicated by box 20 of FIG. 1.

The creation of the MSTs and the redefinition of the partitions to link the members of the sets are iterated 22 for each level of the partition tree. When the top level of the partition tree is reached, 22, then the top-level MST is created 24.

To create a minimal spanning tree, any of the well known algorithms can be used. The inventors of the present invention have used Steiner's tree with good results. The details of the method to create an MST for any set of vertices are discussed in the Minimal Spanning Tree section below.

The partition tree is distinguishable from the minimal spanning tree. The partition tree represents the iterative partitioning of the pins into pp's, the pp's into sets, and the sets into meta-sets, and so on until the highest level of meta sets is formed. The MST represents the relationship, or interconnection between the sets and all of the members of any set.

For instance, at the lowest level, the pins are partitioned into pp's having, on average, approximately K pins belong to each pp's. After assigning the pins to the pp's, an MST is generated for each set whereby the pins of each of the sets are connected to the other pins of the set to minimize the traversal, or spanning of the pins of the set. Then, each of the sets of the pp's are thus connected, and so on.

The result of the above operations is one large MST at the top level of the partition tree where each of the vertices of the top level MST represents, on average, approximately K number of sets. That is, each node of the top level MST represents, on average, approximately 20 (the value of K in the example) subnodes, each of which, in turn, represent, on average, about 20 sub-subnodes, and so on. At the leaf level of the MST, each of the pp's represents, on average, about 20 pins. In fact, all of the sets belonging to the same level of the partition tree represents roughly the same number of pins. Consequently, if the same number of nodes of the MST is assigned to each of the multiple processors, then the processors will have approximately the same number of pins to connect. This leads to balanced work load among the processors and efficient implementation of parallel processing technique.

Furthermore, the routing process itself will be efficient because, as will be explained below, the present invention partitions the pins into clusters of pins near each other.

Partitioning Method

The pins of the net are partitioned as discussed below.

First, from each pin of the net as a center pin, a neighborhood is constructed. Each of the neighborhoods contains at least K pins of the net. The neighborhood is constructed for the centerpin as follows:

a. find the nearest pin from the center pin;
   b. determine the distance (rectilinear distance is used in this example but Euclidean distance can be used) to the nearest pin;

c. define a bounding box to include the nearest pin;

d. if any other pins are included within the bounding box, include the other pins in the neighborhood; and e. if the neighborhood contains less than K pins, then find the next nearest pin (not yet a member of the neighborhood) and repeat the steps b to e.

Figure 2:
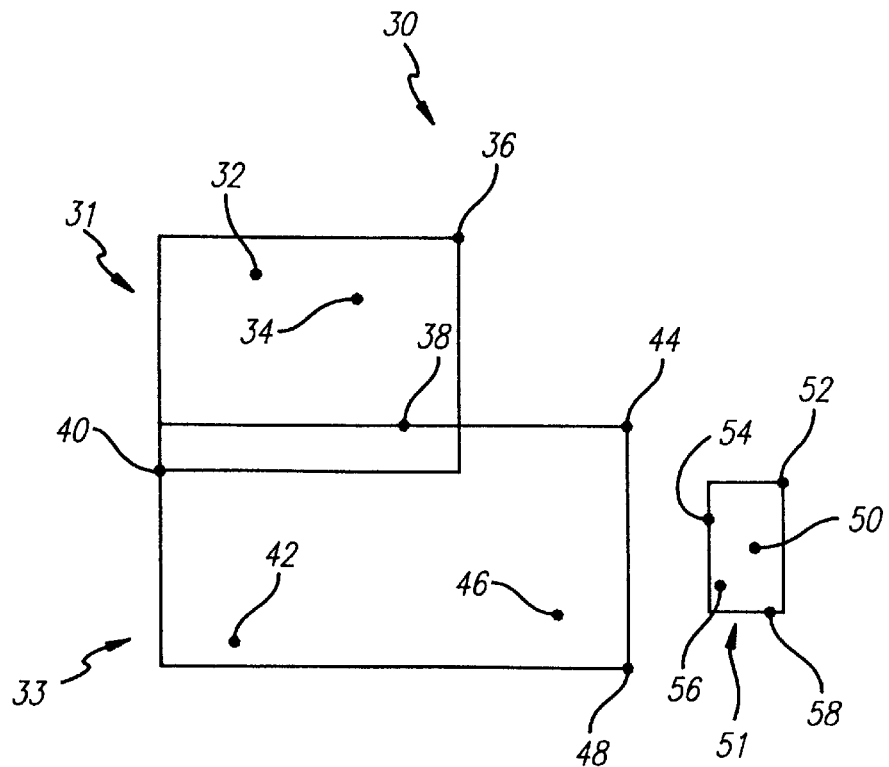
FIG. 2 illustrates construction of neighborhoods of pins in accordance with a preferred embodiment of the present invention.

Referring to FIG. 2, a sample net 30 with fourteen (14) pins is shown. For simplicity of discussion, K is assumed to have a value of five (5). Also for simplicity, only three neighborhoods 31, 33, and 51 are illustrated by the figure. Neighborhood 31, with center pin 32, was constructed by first including pin 34, then, in order, pins 46, 38, and 40 for a total of five (5=K) pins. Likewise, neighborhood 51, with center pin 50, was constructed by including, in order, pins 56, 58, 54, and 52 for a total of five (5=K) pins.

Neighborhood 33, with center pin 42, was constructed by first including pin 40, then pin 38, then pin 46, then pins 44 and 48 at the same time, resulting in a total of six (6) pins which is greater than K pins. Neighborhood 33 contains six pins because the inclusion of pins 40, 38, and 46 resulted in only four (4) pins in its neighborhood, and the inclusion of pin 48 caused the bounding box to expand to include pin 44.

Second, the net is covered, or partitioned, with the neighborhoods with highest ratio between the number of pins in the neighborhood (not already used by another neighborhood) divided by the geometric area of the neighborhood. This ratio indicates how "clustered" the pins are. Because the number of pins in the neighborhood is approximately K, the determining factor is the geometric area of the neighborhood. A high ratio indicates that the pins of the neighborhood are clustered together within a small area. On the other hand, a low ratio indicates that the pins of the neighborhood are apart from each other.

The covering of the net is accomplished as follows:

f. analyze each of the neighborhood to determine its ratio;

g. select the neighborhood, among the remaining neighborhoods, with the highest ratio;

h. the selected neighborhood covers its pins; and i. repeat steps a to c until all of the pins are covered.

Continuing to refer to FIG. 2, it seems that neighborhood 51 has the highest ratio. Also, neighborhood 31 appears to take much less geometric space than neighborhood 33, and is likely to be selected before neighborhood 33 to cover pins 38 and 40 as well as pins 32, 34, and 36. However, neighborhood 33 will continue to be analyzed until all of the pins are covered—either by neighborhood 33 or by another neighborhood which includes pins 42, 44, 46, and 48 and has a greater ratio of pins to area. The neighborhoods selected to cover its pins are called the covering neighborhood. Each of the covering neighborhoods has a set of pins (numbering at least K pins including its center pin) which it covers.

Third, after all of the pins have been covered, the center pins of the covering neighborhoods are used to construct pin partitions. The pin partitions are created by taking all of the center pins, and assigning all other pins of the net to the closest center pin. For the purposes of partition construction, the neighborhood definitions are abandoned. The neighborhood definitions were used only to determine the center pins of the partitions.

Therefore, in the example as illustrated by FIG. 2, assuming that all three neighborhoods 31, 33, and 51 were selected as covering neighborhoods, pins 44, 46, and 48, as well as pins 52, 54, 56, and 58 will be assigned to the partition having pin 50 as its center pin. Pins 34, 36, and 38 will be assigned to the partition with pin 32 as the center pin. Pin 40 will be assigned to the partition with center pin 42. Then, the resultant pin partitions will appear as illustrated by FIG. 3.

Figure 3:
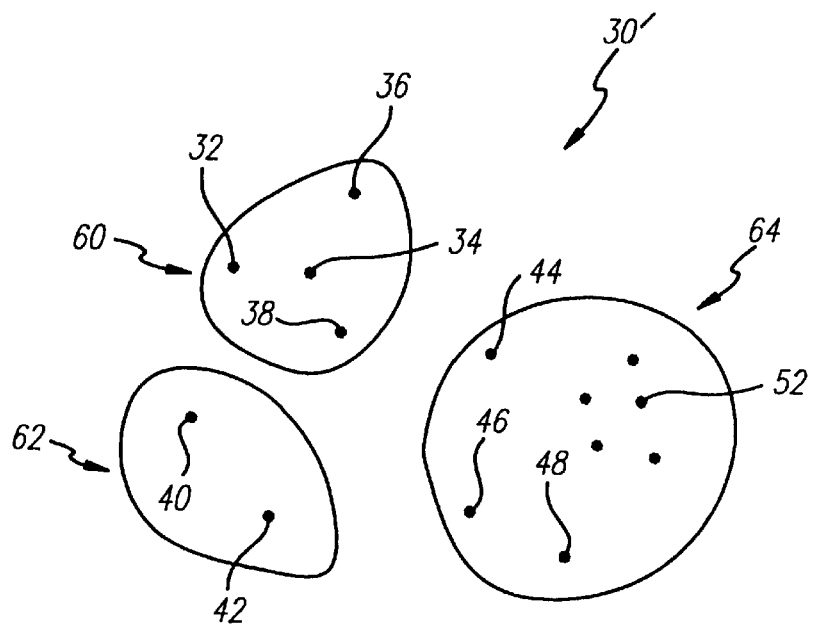
FIG. 3 illustrates construction of partitions of pins in accordance with a preferred embodiment of the present invention.

The net as illustrated by FIGS. 2 and 3 resulted in only three pin partitions (pp's) 60, 62, and 64. However, in practice, a net may result in many thousands of pp's requiring another application of the Partitioning Method with the pp's as the "elements" for the next level of analysis. The iterative application of the Partitioning Method can be repeated until the number of the resultant partitions (or meta sets) is in the order of magnitude of the value of K. Typically, the resultant partitions are considered manageable when the number of partitions is in the same order of magnitude as the parameter K.

Minimal Spanning Tree and Partition Routing

Following the construction of the partition tree. The pp's and the meta sets are organized into minimum spanning trees (MST). To construct an MST for a set of pp's, the center pins of each of the pp's are considered as the vertices and the distance between any two pp's is defined as the distance between the closest pins of the two partitions. FIG. 3 illustrates three pp's 60, 62, and 64 having center pins 32, 42, and 52. Each of the remaining pins of the net 30' is assigned to the nearest center pin from itself. Therefore, pin partition 60 contains pins 32, 34, 36, and 38, partition 62 contains pins 40, 42, and partition 64 contains pins 44, 46, 48, 50, 52, 54, 56, and 58.

Referring to FIG. 3, for the purposes of constructing the MST for the pp's 30', the distance between partition 60 and partition 62 is the distance between a pins 32 and 40. The distance between partition 60 and partition 64 is the distance between pins 38 and 44. The distance between partition 62 and partition 64 is the distance between pins 42 and 46.

Given the partitions and the distances between the partitions, the process of constructing a MST from the given information is well known in the art and will not be discussed here. Professor James A. McHugh provides an adequate overview of the MST construction method in ALGORITHMIC GRAPH THEORY (1990, Prentice-Hall) pp. 124–126.

Once a MST is constructed, each of the connected partitions (as represented by the connected vertices of the MST) are connected as follows:

j. the two pins which determined the distance between the two partitions are identified;

k. for each of the two pins, calculate the minimal distance between the pin and any of the other pins of its partition; and l. the pin whose just calculated distance is greater is assigned to the partition of the other pin as well as retaining its assignment to the original partition.

Referring again to FIG. 3, assuming that the vertices representing partitions 62 and 64 are connected in the MST, partitions 62 and 64 are connected following the steps defined above. In FIG. 2, the pin pair for connecting partitions 62 and 64 are pins 42 and 46, respectively. It appears that the distance between pins 42 and 40 in partition 62 is greater than the distance between pins 46 and 48 in partition 64. Therefore, pin 42 is assigned to partition 64 as well as retaining its assignment to partition 62.

Likewise, assuming that the vertices representing partitions 60 and 62 are connected in the MST, partitions 60 and 62 are connected following the steps defined above. Continuing to refer to FIG. 2, the pin pair for connecting partitions 60 and 62 are pins 32 and 40, respectively. It appears that the distance between pins 32 and 34 in partition 60 is greater than the distance between pins 40 and 42 in partition 62. Therefore, pin 40 is assigned to partition 60 as well as retaining its assignment to partition 62.

Figure 4:
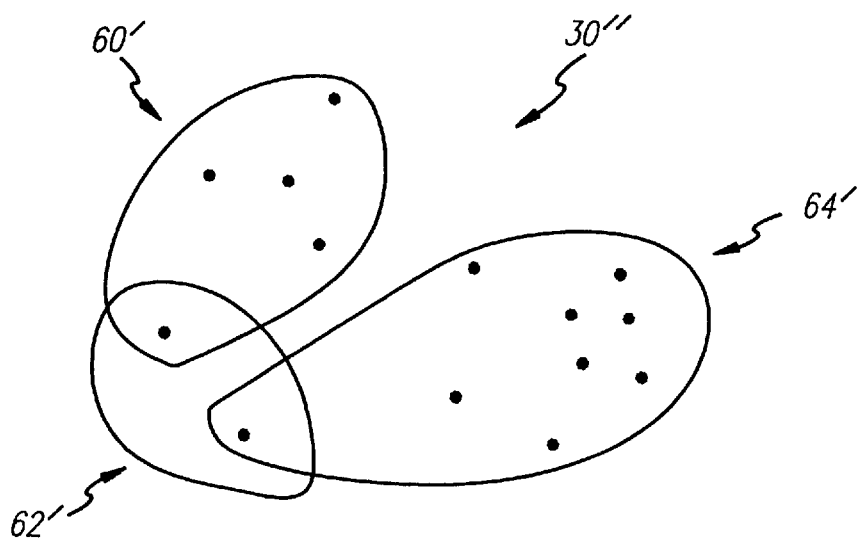
FIG. 4 illustrates modification of partitions of pins in accordance with a preferred embodiment of the present invention.

After the additional assignments of pins 40 and 42 of partition 62, the partition of the net may be graphed as illustrated by FIG. 4. Because the partitions now overlap, the routing of the cells of the partitions will not be limited to the boundaries of the cells. In addition, the routing of the net will not have closed loops or cycles because the partitions are organized using a MST structure.

Similar to the iterative application technique used to partition the pins and the sets of pins, the MST and the above-described partition routing technique can be applied interactively to effect the same connections between sets of partitions and meta sets of the sets of partitions.

Apparatus

Figure 5:
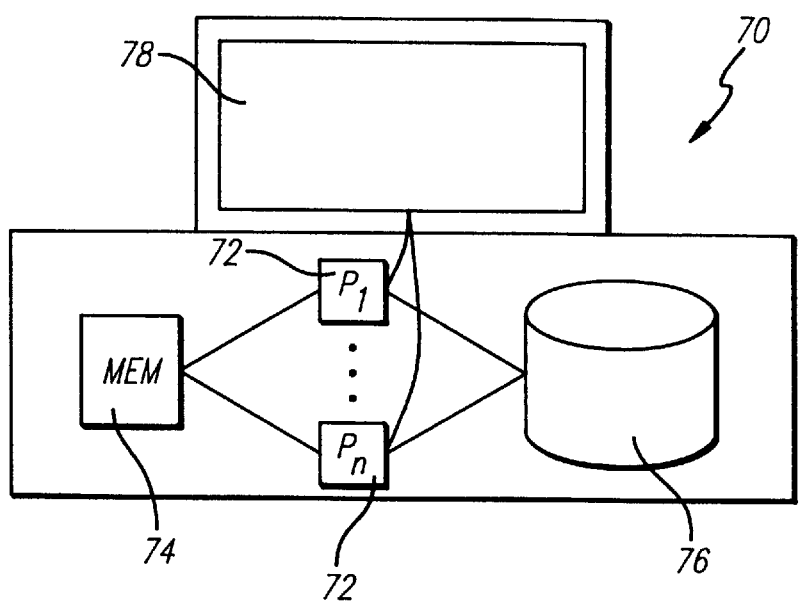
FIG. 5 illustrates an apparatus in accordance with a preferred embodiment of the present invention.

Referring now to FIG. 5, an apparatus 70 for parallelizing net routing is illustrated. The apparatus 70 comprises a plurality of processors 72 and memory 74 connected to the processors for storing instructions for the processors 72. The memory stores the instructions for the processors to perform the above-discussed tasks. The harddrive 76 contains the initial net and pin layout information and stores computer readable representation of the final pin connections. The pin connections and the system status information may be displayed on the monitor 78 which is also attached to the processors.

Summary

The specific algorithms described herein, as well as the basic steps which they represent (even if they are replaced by different algorithms), are designed for implementation in a general purpose computer. Furthermore, each of the algorithms described herein, as well as the basic steps it represents, can be encoded on computer storage media such as CD ROMS, floppy disks, computer hard drives, and other magnetic, optical, other machine readable media, whether alone or in combination with one or more of the algorithms and steps described herein.

Although the present invention has been described in detail with regarding the exemplary embodiments and drawings thereof, it should be apparent to those skilled in the art that various adaptations and modifications of the present invention may be accomplished without departing from the spirit and the scope of the invention. Thus, by way of example and not of limitation, the present invention is discussed as illustrated by the figures. Accordingly, the invention is not limited to the precise embodiment shown in the drawings and described in detail hereinabove.

In the following claims, those elements which do not include the words "means for" are intended not to be interpreted under 35 U.S.C. § 112 ¶ 6.

We claim:

1. A method of organizing pins of a net, said method comprising:
    partitioning the pins into a plurality of sets, each set having at least a predetermined number of pins; and
    constructing a minimal spanning tree having vertices and edges, said vertices of said spanning tree representing the sets.

2. The method according to claim 1 wherein said step of partitioning the pins comprises:
    (a) constructing a neighborhood of pins for each of the pins, each neighborhood having a center pin;
    (b) calculating a cluster ratio for each of said neighborhoods;
    (c) selecting neighborhoods based upon the cluster ratios calculated in step (b);
    (d) assigning each of the pins to a center pin for one of the neighborhoods selected in step (c); and
    (e) defining a partition as a center pin and all of its assigned pins.

3. A computer implemented method for connecting pins of a net, said method comprising:
    creating partitions of pins and sets of partitions;
    constructing a minimal spanning tree (MST) for the pins in each partition, a MST for the partitions in each set, and a MST for the sets; and
    assigning construction of each MST to one of a plurality of processors.

4. The method according to claim 3 wherein said step of creating pin partitions comprises:
    defining each of the pins as a center pin;
    for each said center pin, defining a neighborhood by:
        i. finding a nearest pin from said center pin that does not already belong to said neighborhood;
        ii. expanding a bounding box to include said nearest pin in said neighborhood;
        iii. including, within said neighborhood, any other pins which fall within said bounding box and are not already a part of said neighborhood; and
        iv. repeating steps i to iii until at least a predetermined number of pins belong to said neighborhood.

5. The method according to claim 4 further comprising:
    a. determining a cluster ratio for each of said neighborhoods;
    b. selecting a first neighborhood with the highest cluster ratio;
    c. denoting the pins of said selected neighborhood as being covered;
    d. selecting a next neighborhood with the next highest cluster ratio; and
    e. repeating steps c and d until all pins are covered.

6. The method according to claim 5 further comprising:
    identifying the center pins of said selected neighborhoods;
    assigning each of the pins to the identified center pin closest to said pin; and
    forming a plurality of partitions, each partition including one of the identified center pins and all the pins assigned to said center pin.

7. The method according to claim 3 wherein said step of constructing the minimal spanning trees (MSTs) comprises:
    a. identifying a first pin in a first partition and a second pin in a second partition where the distance between said first pin and said second pin is less than the distance between any other pair of pins in which one is selected from the first partition and one is selected from the second partition;
    b. determining a first distance between the first pin and another pin in the first partition;
    c. determining a second distance between the second pin and another pin in the second partition;
    d. assigning the first pin to the second partition if the first distance is greater than the second distance; and
    e. assigning the second pin to the first partition if the second distance is greater than the first distance; and
    f. constructing the MST for the first partition, including the assigned pin, and constructing the MST for the second partition, including the assigned pin.

8. An apparatus for connecting pins of a net comprising:
    a plurality of processors;
    memory connected to said processors;
    said memory having instructions for said processors to partition the pins, to construct a minimal spanning tree using the partitions as nodes of said tree; and to assign each of the partions to one of said processors to connect the pins in said partition.

9. The apparatus according to claim 8 wherein said processors operate simultaneously to connect the pins.

10. The apparatus according to claim 8 further comprising a storage device connected to said processors.

11. The apparatus according to claim 10 wherein said storage device is a computer hard drive.

12. The apparatus according to claim 8 wherein the instructions for said processors to partition the pins include instructions to:
   define neighborhoods of pins, each neighborhood having a center pin and a cluster ratio;
   select the neighborhoods that are most clustered, based on the cluster ratios; and
   define partitions using the center pins of the selected neighborhoods.

13. A computer storage medium containing instructions for organizing integrated circuit pins for routing purposes, said instructions comprising:
   partitioning the pins into a plurality of sets, each set having at least a predetermined number of pins; and
   constructing a spanning tree having vertices and edges, said vertices of said spanning tree representing said plurality of sets.

14. The storage medium according to claim 13 wherein said storage medium is selected from a group consisting of a magnetic device, an optical device, a magneto-optical device, a floppy diskette, a CD-ROM, magnetic tape, a computer hard drive, and a memory card.

15. A method of routing connections between pins in a net, comprising:
   partitioning the pins into sets;
   identifying distances between pairs of sets;
   routing connections between the sets based on the distances identified; and
   routing connections between the pins in each set.

16. A method according to claim 15, wherein connections are routed between the sets by constructing a minimum spanning tree.

17. A method according to claim 15, wherein the distance between a pair of sets is defined as a distance between two closest pins, one from each set in the pair.

18. A method according to claim 17, further comprising a step of, for each pair of sets, assigning one of the two closest pins to both sets in the pair.

19. A method according to claim 15, further comprising a step of assigning each set to one of a plurality of processors for routing connections between the pins therein.

20. A method according to claim 15, further comprising a step of partitioning the sets into higher level sets.

21. A method according to claim 20, further comprising a step of repeating said step of partitioning sets into higher level sets until each higher level set has no more than approximately a predetermined number of lower level sets.

22. A method according to claim 15, wherein each set has no more than approximately a predetermined number of pins.

23. A method according to claim 15, wherein connections are routed between the pins in a set by constructing a minimum spanning tree.

\* \* \* \* \*